(12) United States Patent  (10) Patent No.: US 8,080,824 B2
Chen et al.  (45) Date of Patent: Dec. 20, 2011

(54) SUPPRESSING RECOMBINATION IN AN ELECTRONIC DEVICE

(75) Inventors: Kuei-Hsien Chen, Taipei (TW); Chien-Hung Lin, Nantou County (TW); Chia-Wen Hsu, Changua County (TW); Li-Chyong Chen, Taipei (TW)

(73) Assignee: Academia Sinica (TW)

( * ) Notice: Subject to any disclaimer, the term of this patent is extended or adjusted under 35 U.S.C. 154(b) by 1244 days.

(21) Appl. No.: 11/560,157

(22) Filed: Nov. 15, 2006

(65) Prior Publication Data

US 2008/0110499 A1   May 15, 2008

(51) Int. Cl.
*H01L 29/00* (2006.01)

(52) U.S. Cl. .............. 257/51; 257/50; 257/78; 257/94; 257/E27.12; 257/E33.005

(58) Field of Classification Search .......... 257/50, 257/51, 78, 88, 90, 94, 200
See application file for complete search history.

(56) References Cited

U.S. PATENT DOCUMENTS

| | | | |
|---|---|---|---|
| 4,758,868 A * | 7/1988 | Frijlink | 257/26 |
| 6,157,047 A * | 12/2000 | Fujita et al. | 257/51 |
| 6,838,743 B2 * | 1/2005 | Yamada et al. | 257/461 |
| 6,933,436 B2 | 8/2005 | Shaheen et al. | |
| 6,936,143 B1 | 8/2005 | Graetzel et al. | |
| 6,972,431 B2 | 12/2005 | Forrest et al. | |
| 2007/0012349 A1* | 1/2007 | Gaudiana et al. | 136/244 |
| 2007/0046192 A1* | 3/2007 | Akai et al. | 313/506 |

OTHER PUBLICATIONS

Baldo, M. A. & S.R. Forrest, "Interface-Limited Injection in Amorphous Organic Semiconductors." *The American Physical Society, Physical Review B*, vol. 64, Aug. 15, 2001 (pp. 085201-1 to 085201-17).

Deng, Z.B. et al., "Enhanced Brightness and Efficiency in Organic Electroluminenscent Devices using SiO$_2$ Buffer Layers." *Applied Physics Letters*, vol. 74, No. 15, Apr. 12, 1999 (pp. 2227-2229).

Peumans, P. et al., "Small Molecular Weight Organic Thin-Film Photodetectors and Solar Cells." *J. of Applied Physics*, vol. 93, No. 7, Apr. 1, 2003 (pp. 3693-3723).

Kim, Y. et al., "Enhanced Quantum Efficiency in Polymer Electroluminescence Devices by Inserting a Tunneling Barrier Formed by Langmuir-Blodgett Films," *Applied Physics Letters*, vol. 69, No. 5, Jul. 29, 1996 (pp. 599-601).

Kondakov, D.Y., "Voltammetric Study of Bphen Electron-Transport Layer in Contact with LiF/Al Cathode in Organic Light-Emitting Diodes." *J. of Applied Physics*, vol. 99, 2006 (pp. 024901-1 to 024901-3).

Lee, J. et al., "High Efficiency Organic Light-Emitting Devices with Al/NaF Cathode." *Applied Physics Letters*, vol. 82, No. 2, Jan. 13, 2003 (pp. 173-175).

O'Brien, D.F. et al., "Improved Energy Transfer in Electrophosphorescent Devices." *Applied Physics Letters*, vol. 74, No. 3, Apr. 12, 1999 (pp. 442-444).

Wang, X. J. et al., "Enhancement of Electron Injection in Organic Light-Emitting Devices Using an Ag/LiF Cathode." *J. of Applied Physics*, vol. 95, No. 7, Apr. 1, 2004 (pp. 3828-3830).

(Continued)

*Primary Examiner* — Fernando L Toledo

(74) *Attorney, Agent, or Firm* — Fish & Richardson P.C.

(57) ABSTRACT

A semiconductor material structure includes at least one region capable of generating electrons and holes each having an associated mean kinetic energy during operation. A material layer in proximity to the region provides an associated potential energy larger than the mean kinetic energy associated with the generated electrons and the mean kinetic energy associated with the holes.

49 Claims, 3 Drawing Sheets

OTHER PUBLICATIONS

Zhan, Y. Q. et al., "Sodium Stearate, an Effective Amphiphilic Molecule Buffer Material Between Organic and Metal Layers in Organic Light-Emitting Devices." *Applied Physics Letters*, vol. 83, No. 8, Aug. 25, 2003 (pp. 1656-1658).

Zhang, S.T. et al, "Buffer-Layer-Induced Barrier Reduction: Role of Tunneling in Organic Light-Emitting Devices." *Applied Physics Letters*, vol. 84, No. 3, Jan. 19, 2004 (pp. 425-427).

Ackermann, J. et al., "Highly Efficient Hybrid Solar Cells Based on an Octithiophene-GaAs Heterojuntion." *Advanced Functional Materials*, vol. 15, No. 5, May 2005 (pp. 810-817).

Xue, J. et al., "A Hybrid Planar-Mixed Molecular Heterojunction Photovoltaic Cell." *Advanced Materials*, vol. 17, No. 1, Jan. 6, 2005 (pp. 66-71).

\* cited by examiner

SUPPRESSING RECOMBINATION IN AN ELECTRONIC DEVICE

BACKGROUND

The invention relates to suppressing recombination in an electronic device.

Various types of electronic devices include semiconductor material structures that convert energy between photons and excited bound electron-hole pairs called "excitons". Light absorbing devices such as photodetectors and solar cells (e.g., "photovoltaic cells") generate excitons from absorbed photons. The separation of the electron and hole of an exciton to separate cathode and anode electrodes, respectively, contributes to a generated electrical current. Recombination of free electrons and holes reduces the electrical current and the resulting efficiency of the device. Light emitting devices such as light emitting diodes (LEDs) generate photons from injected electrons and holes while solar cells generate electrons and holes from incident photons. Various types of semiconductor material structures can be formed. For example, photodiodes can include p-n junctions or p-i-n structures. A phototransistor can generate photons from a transistor structure. An LED can also be formed from a p-n or p-i-n structure, and emits light when forward biased.

Different devices include different types of materials. Some devices such as organic solar cells and organic electroluminescent devices (or organic light emitting devices "OLEDs") incorporate organic materials. Some devices include a thin layer of a material on an electrode of a structure to enhance their performance. For example, an electron injection layer (or "electron-transport layer") on an electrode can be used to improve the performance of OLEDs. Some devices use an exciton blocking layer on an electrode to prevent excitons from arriving the electrode and thereby increase the efficiency of the device, such as a solar cell. Some organic devices use an inorganic "buffer layer" between the anode and an organic hole-transporting layer to enhance the electroluminescence of the organic device.

SUMMARY

In one aspect, in general, the invention features an apparatus. The apparatus includes a semiconductor material structure that includes at least one region capable of generating electrons and holes each having an associated mean kinetic energy during operation. The apparatus includes a material layer in proximity to the region, the material layer providing an associated potential energy larger than the mean kinetic energy associated with the generated electrons and the mean kinetic energy associated with the holes.

In another aspect, in general, the invention features a method for manufacturing a device. The method includes providing a region in a semiconductor material structure of the device that, during operation of the device, generates electrons and holes, each having an associated mean kinetic energy. The method further includes incorporating a material layer in the semiconductor material structure in proximity to the region to allow electrons generated from the region having the mean kinetic energy to tunnel through the material layer with a probability higher than a first probability and to allow holes generated from the region having the mean kinetic energy to tunnel through the material layer with a probability lower than a second probability.

Aspects of the invention can include one or more of the following features.

The material layer has a thickness such that electrons generated from the region having the mean kinetic energy tunnel through the material layer with a probability higher than about 50% and such that holes generated from the region having the mean kinetic energy tunnel through the material layer with a probability lower than about 50%.

The material layer has a thickness such that electrons generated from the region having the mean kinetic energy tunnel through the material layer with a probability higher than about 60% and such that holes generated from the region having the mean kinetic energy tunnel through the material layer with a probability lower than about 40%.

The material layer has a thickness such that electrons generated from the region having the mean kinetic energy tunnel through the material layer with a probability higher than about 90% and such that holes generated from the region having the mean kinetic energy tunnel through the material layer with a probability lower than about 10%.

The material layer has a thickness such that holes generated from the region having the mean kinetic energy tunnel through the material layer with a probability higher than about 50% and such that electrons generated from the region having the mean kinetic energy tunnel through the material layer with a probability lower than about 50%.

The material layer comprises a material that is electrically insulating.

The material layer consists essentially of a material selected from the group consisting of: a crystalline material, an amorphous material, an organic material, and a polymer material.

The material layer consists essentially of a material selected from the group consisting of: an oxide material, a nitride material, a fluoride material, and a chloride material.

The material layer consists essentially of a self-assembled monolayer.

The region of the semiconductor material structure is capable of generating pairs of electrons and holes in response to absorbing light in the semiconductor material structure.

The material layer is located closer to the region capable of generating electrons and holes than to an electrode of the semiconductor material structure.

The semiconductor material structure comprises a p-type semiconductor material and an n-type semiconductor material.

The region capable of generating electrons and holes comprises a depletion region associated with the semiconductor materials.

The material layer is located between the p-type and n-type semiconductor materials.

The semiconductor material structure further comprises an intrinsic semiconductor material between the p-type and n-type semiconductor materials.

The material layer is located between the intrinsic semiconductor material and the n-type semiconductor material.

The apparatus further comprises an electrically conducting material configured to receive holes from the p-type semiconductor material, and an electrically conducting material configured to receive electrons from the n-type semiconductor material.

The apparatus further comprises a second material layer between the n-type semiconductor material and the electrically conducting material configured to receive electrons from the n-type semiconductor material, the second material layer having an associated potential energy larger than the mean kinetic energy associated with the generated electrons and the mean kinetic energy associated with the generated holes.

The p-type semiconductor material comprises an organic material.

The p-type semiconductor material comprises a Phthalocyanine material.

The n-type semiconductor material comprises an inorganic material.

The n-type semiconductor material comprises Silicon.

The material layer comprises a crystalline material.

The material layer consists essentially of a material selected from the group consisting of: an oxide material, a nitride material, a fluoride material, and a chloride material.

The material layer comprises Lithium Fluoride.

The material layer has a thickness between about 0.2 nm and about 5 nm.

The material layer has a thickness between about 0.5 nm and about 2 nm.

The material layer has a thickness of about 1 nm.

The apparatus further comprises a plurality of material layers in proximity to the region, each of the material layers having an associated potential energy larger than the mean kinetic energy associated with the generated electrons and the mean kinetic energy associated with the generated holes.

At least some of the plurality of material layers are on a first side of the region, and at least some of the plurality of material layers are on a second side of the region opposite to the first side.

The material layer has an associated potential energy larger than a maximum kinetic energy associated with the generated electrons and holes.

The semiconductor material structure is configured as a solar cell.

The semiconductor material structure is configured as a photodetector.

Aspects of the invention can have one or more of the following advantages.

Incorporating recombination suppression (RS) layer into a semiconductor structure can increase the power conversion efficiency (PCE) of solar cells, enabling solar cells to contribute more substantially to meeting energy needs in various applications. For example, properties of the RS layer such as thickness can be selected to allow a relatively high tunneling probability for electrons and a relatively low tunneling probability for holes. Electrons may drift to a cathode side of the RS layer (tunneling through if necessary), and holes on the anode side of the RS layer are less likely to cross and recombine with those electrons. Thus, recombination can be suppressed, which increases the generated electrical current for a given amount of light power absorbed.

Other features and advantages of the invention will become apparent from the following description, and from the claims.

DESCRIPTION

As described above, recombination of free electrons and holes back into excitons can reduce the power generation efficiency of devices such as solar cells or photodetectors. A "recombination suppression" (RS) material layer (e.g., a thin layer of electrically insulating material or material with high resistivity) incorporated into a device's semiconductor structure can provide a selectively tunneling barrier that acts as a sieve to separate electrons and holes and reduce the probability that recombination occurs. The material layer can be located in proximity to a region in a semiconductor structure that is capable of generating electrons and holes. For example, electrons and holes can be generated from excitons that form in or near a depletion region in response to absorbed photons.

When the device is in operation, the generated free carriers, electrons and holes, each have an associated mean kinetic energy. The kinetic energy distribution of the electrons and the kinetic energy distribution of the holes may be different, but typically correspond to respective mean kinetic energies that are comparable in magnitude. The material layer provides an associated "barrier" potential energy that is larger than these mean kinetic energies, such that most electrons and holes have a kinetic energy that is lower than this barrier potential energy level. Quantum tunneling is a quantum mechanical phenomenon by which a particle can pass from one side of the layer to the other even though the particle has a lower kinetic energy than the potential energy barrier presented by the layer. Quantum tunneling enables some of these electrons and holes to "tunnel" through the material layer with a probability that depends on the effective mass of the carrier. Thus, as described in more detail below, electrons are more likely to tunnel through the material layer than holes, which (for certain material and geometric properties) creates a sieve effect to separate generated electrons and holes and reduce the likelihood of recombination.

Figure 1A:
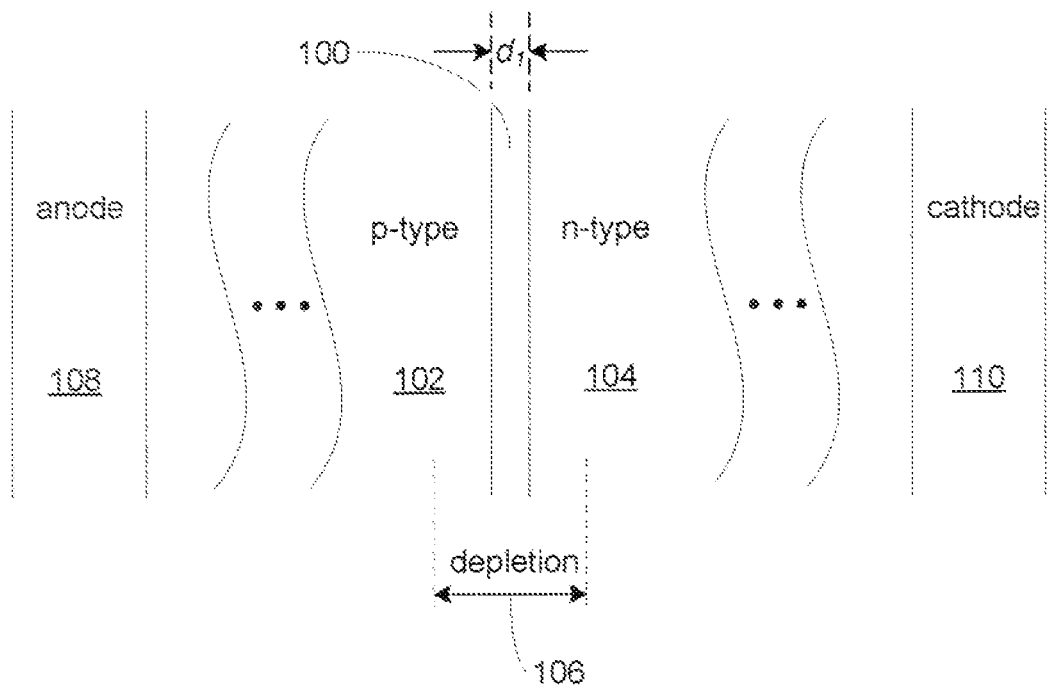
FIGS. 1A-1C are diagrams of a semiconductor material structures.

Referring to FIG. 1A, a semiconductor material structure in a device such as a solar cell includes a material layer 100 that provides a selectively tunneling potential energy barrier through which electrons and holes are able to tunnel with different probabilities. On one side of the material layer 100 is a p-type semiconductor material 102, and on the other side of the material layer 100 is an n-type semiconductor material 104. The thickness $d_1$ of the material layer 100 is selected to have a value (e.g., on the order of a nanometer) that produces the tunneling properties described herein. The thickness $d_1$ is small enough so that electrons and holes acquire at least some of the characteristics typically associated with a junction between p-type and n-type semiconductor materials. Thus, even though the material layer 100 is between the p-type semiconductor material 102 and the n-type semiconductor material 104, a p-n junction is formed and generates an associated depletion region 106 (or "space charge region"), which, in this example, encompasses the material layer 100.

An anode 108 on the other side of the p-type semiconductor material 102 receives holes pulled by an internal electric field from near the depletion region 106, and a cathode 110 on the other side of the n-type semiconductor material 104 receives electrons pulled in the opposite direction. The anode 108 and cathode 110 electrodes can be formed directly adjacent to the respective semiconductor materials, or in some configurations, the electrodes can be coupled to the semiconductor materials to receive the respective carriers through a layer that passes at least some of the respective carriers. In this example, the anode 108 is adjacent to the other side of the p-type semiconductor material 102, and the cathode 110 is adjacent to the other side of the n-type semiconductor material 104.

Figure 1B:
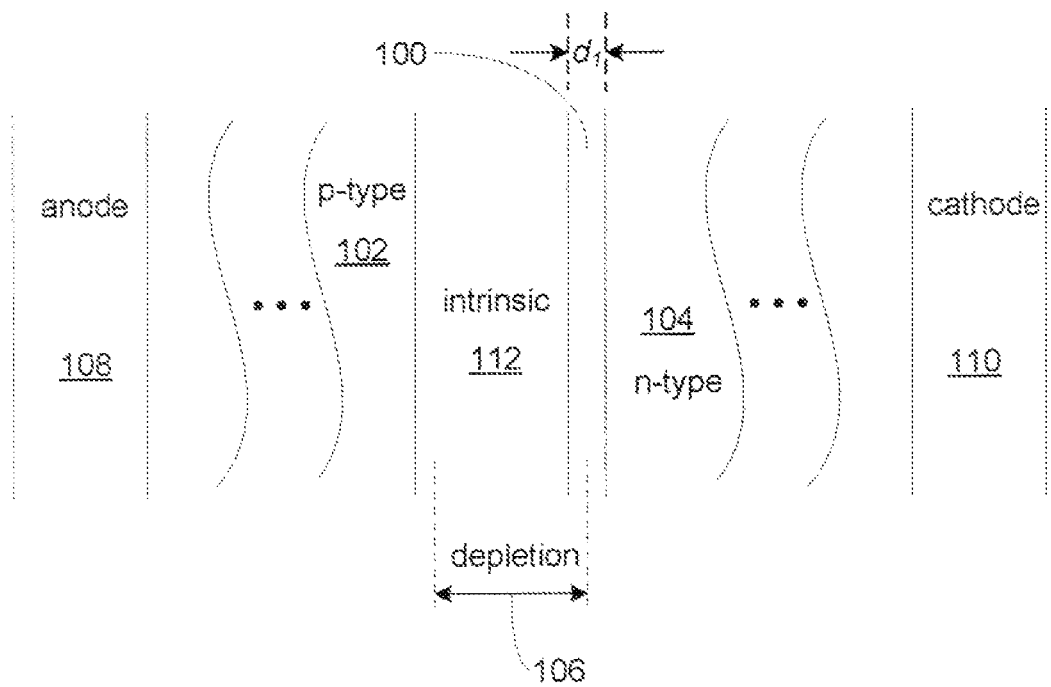

Other arrangements of materials are possible in the semiconductor material structure. For example, referring to FIG. 1B, a p-i-n semiconductor material structure includes an intrinsic material layer 112 (e.g., an undoped semiconductor) between the p-type and n-type semiconductor materials. The depletion region 106 is contained mostly within this intrinsic material layer 112. In this example, the material layer 100 provides a RS layer between the intrinsic material layer 112 and the n-type semiconductor material 104. Thus, if free electrons and holes are generated from excitons that form in the depletion region 106, the holes can be pulled toward the anode 108 without passing through the material layer 100, and the electrons can be pulled toward the cathode after tunneling through the material layer 100.

Figure 1C:
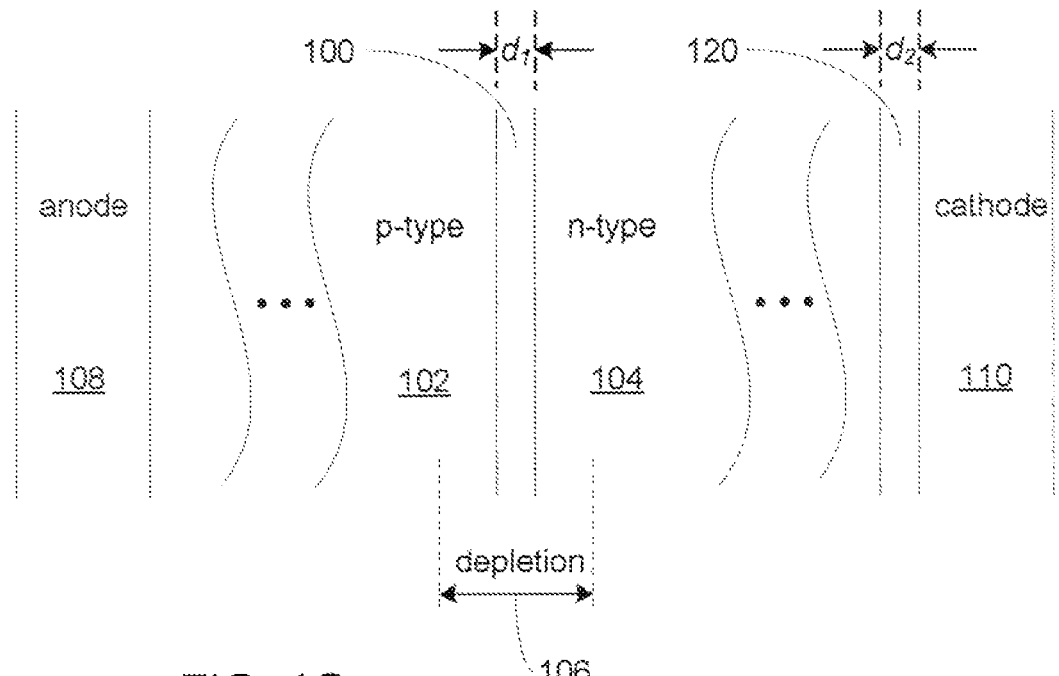
Figure 1D:
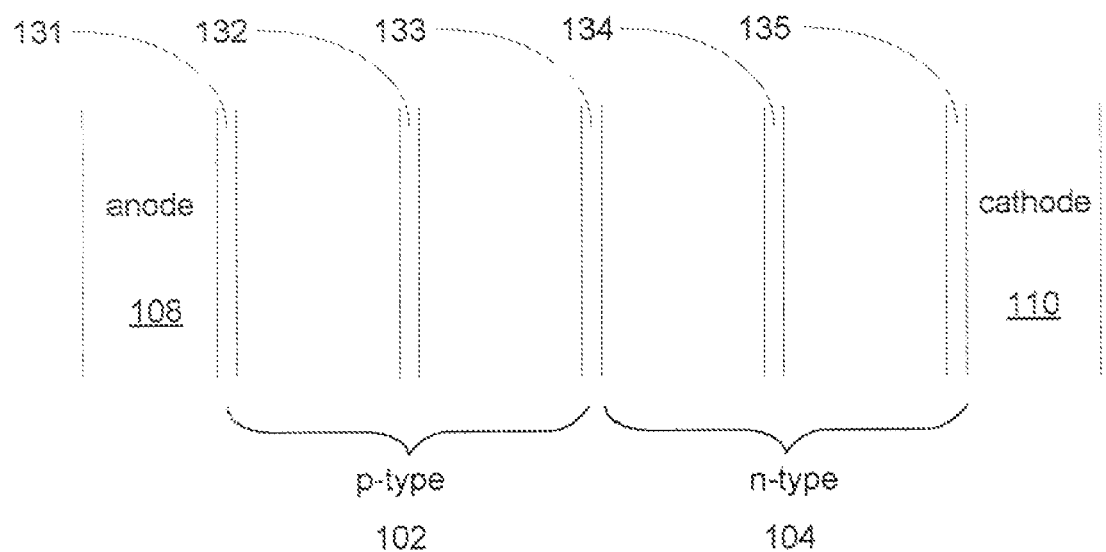
Figure 1E:
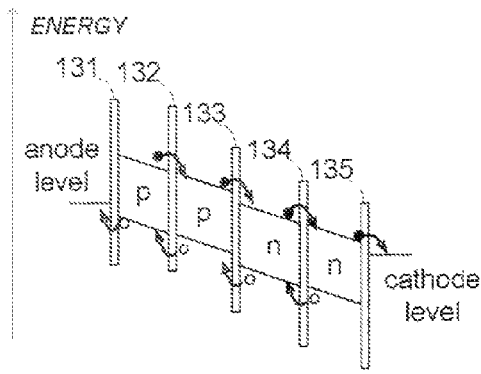

In some devices, multiple RS material layers can be included in the semiconductor material structure. Referring to FIG. 1C, a second material layer 120 is incorporated between the n-type semiconductor material 104 and the cathode 110. The thickness $d_2$ of the second material layer 120 is also selected to have a value (e.g., on the order of a nanometer) that produces the tunneling properties described herein. In other examples, multiple RS material layers can be included throughout a semiconductor material structure. For example, FIG. 1D shows RS layers 131, 132, 133, 134, 135 spaced at regular intervals throughout the p-type material 102 and n-type material 104 including adjacent to the anode 108 and cathode 110. FIG. 1E shows an associated energy level diagram illustrating how the electrons (shown as solid circles) tunnel through the RS layers to an energy level of the cathode 110 due to an electric force created by an electric field, and the holes (shown as open circles) tunnel through the RS layers in the opposite direction to an energy level of the anode 108 due to the electric force. Even though the RS layers may provide a relatively lower probability for the holes to tunnel through, the potential suppression recombination of electrons and holes may still improve efficiency in some cases. The number of RS layers used may depend on factors such as material properties and cost of fabricating the RS layers. The composition and thicknesses of the material layer 100 can be selected to allow electrons generated from excitons in the depletion region 106 that have at least the mean kinetic energy to tunnel through the material layer 100 with a high probability (e.g., higher than about 50%, 60%, or 90%) and to allow holes generated from excitons in the depletion region 106 that have no more than the mean kinetic energy to tunnel through the material layer 100 with a low probability (e.g., lower than about 50%, 40%, or 10%). Thus, the material layer 100 selectively favors tunneling of electrons to allow them to reach the cathode 110, while reducing the number of holes that tunnel through the material layer 100 to potentially recombine with electrons before they reach the cathode 110. The selected thickness of the material to provide desired tunneling probabilities may depend on the composition of the material.

Any of a variety of materials can be selected for the material layer 100. An electrically insulating material can provide the desired potential energy barrier. The material of the layer 100 may include impurities, but can consist essentially of a material such as an oxide material, a nitride material, a fluoride material, or a chloride material. The material layer 100 can have any of a variety of structural properties or chemical properties. The material layer 100 can consist essentially of a crystalline material, an amorphous material, an organic material, a polymer material, or a self-assembled monolayer.

Figure 2:
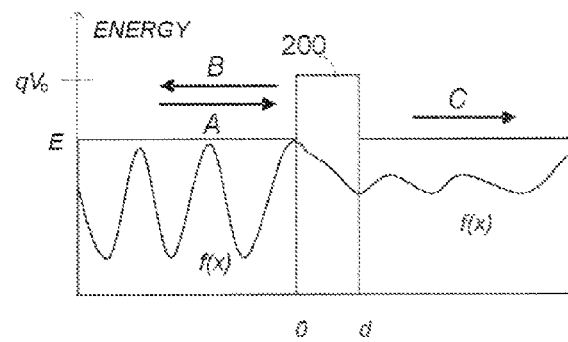
FIG. 2 is a diagram of a quantum mechanical wave function associated with quantum tunneling.

Any of a variety of techniques can be used to estimate quantum tunneling probabilities of carriers (electrons or holes) through a potential barrier in a given structure. For example, the Wentzel-Kramers-Brillouin (WKB) approximation can be used to find a solution of the Schrödinger equation corresponding to the structure. FIG. 2 shows a simplified example of a one-dimensional potential barrier that can be used to derive an approximate dependence of tunneling probability on effective carrier mass. A one-dimensional wave function $f(x)$ of a carrier tunnels through a layer 200 between x=0 and x=d, where $U_o = eV_o$ is the potential energy associated with the layer 200 (where e is the charge of an electron). Thus, the potential energy is $U(x) = U_o$ for $0 < x < d$, and $U(x) = 0$ elsewhere.

The wave function of a carrier (an electron or a hole) associated with a characteristic kinetic energy E (e.g., an average kinetic energy of an electron or a hole) in the region of the layer 200 can be expressed as:

$$f(x) = \begin{cases} A\exp(ikx) + B\exp(-ikx) & x < 0 \\ D\exp(\beta x) + F\exp(-\beta x) & 0 < x < d \\ C\exp(ik(x-d)) & x > d \end{cases}$$

where $k = \sqrt{2mE}/h$, $\beta = \sqrt{2m(eV_o - E)}/h$, m is the effective mass of the carrier, and h is Planck's constant. The probability of the carrier tunneling through the layer 200 is given by the transmission coefficient $$T = \left|\frac{C}{A}\right|^2.$$

Taking into account the continuity condition requiring continuous values of $f(x)$ and $df(x)/dx$ across the boundaries at x=0 and x=d, the transmission coefficient T can be expressed as:

$$T = [1 + (eV_o \sin h\beta d)^2 / 4E(eV_o - E)]^{-1}$$

The transmission coefficient is small for large values of $\beta d$, and can be approximated as:

$$T = \exp(-2\beta d)$$

The transmission coefficient increases for smaller values of $\beta d$. For example, since $\beta = \sqrt{2m(eV_o - E)}/h$, the value of T becomes larger and provides a significant quantum tunneling probability if one or more of the following values is small enough: d, $V_o$, m.

In an example for which $eV_o = 2E$, the value of the transmission coefficient can be expressed as:

$$T = [1 + 2mEd^2/h^2]^{-1}$$

The effective masses, $m_e$ and $m_h$ for electrons and holes, respectively, are typically quite different. For example, $m_h$ can be 3 to 10 times larger than $m_e$. Therefore, the transmission coefficient T can differ significantly for electrons and holes. Due to this effective mass difference, the layer width d can be selected so that electrons tunnel through the layer 200 with relatively high probability, while holes tunnel through the layer 200 with relatively low probability. Thus, most electrons can pass through the layer 200 and most holes are blocked by the layer 200, which provides a sieve effect to separate the electrons and holes and reduce recombination.

The material layer thickness that reduces recombination most and provides the largest increase in efficiency depends on the materials used in a given structure. In some cases, the optimal thickness is on the order of 1 nm (e.g., between about 0.5 nm and about 2 nm, or between about 0.2 nm and about 5 nm).

Figure 3A:
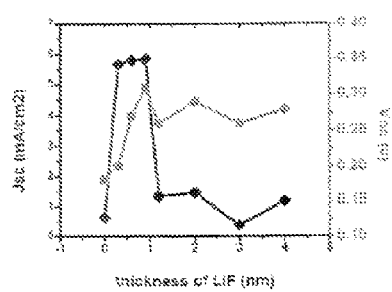
FIGS. 3A and 3B are plots of characteristics of solar cells that include RS layers.
Figure 3B:
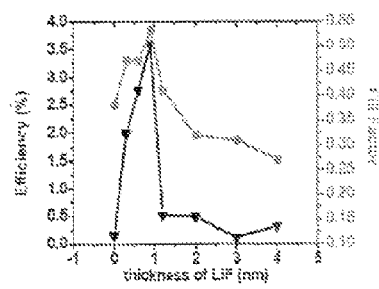

Results from working examples of an RS layer incorporated into an organic/inorganic hybrid solar cell are described with reference to FIGS. 3A and 3B. In a first exemplary structure, a thin layer of Lithium Fluoride (LiF) was used as an RS layer between an organic p-type semiconductor layer consisting of a Phthalocyanine (Pc) material and an inorganic n-type semiconductor layer consisting of Silicon (Si). Thin layers of Aluminum (Al) and Gold (Au) were deposited on the surfaces of the Si and Pc to function as the cathode and anode electrodes, respectively.

An optimal thickness of the tunneling layer was selected by fabricating a series of solar cells with different tunneling layer thickness. FIG. 3A shows plots of the short circuit current (left scale) and open circuit voltage (right scale) of solar cells with different tunneling layer thickness. FIG. 3B shows plots of the power conversion efficiency (left scale) and filling factor (right scale) of solar cells with different tunneling layer thickness. An optimal thickness of about 1 nm was found to yield a power conversion efficiency (PCE) of about 3.6%, which is about 20 times the PCE without the tunneling layer.

Another exemplary structure tested was a double tunneling layer structure including a thin layer of LiF between the Si and Pc and a second thin layer of LiF between the Si and Al. This structure had a PCE of 5.7%.

The RS layer increased PCE for a variety of organic/inorganic hybrid solar cells that used different organic materials including CuPc, ZnPc, P3HT and Alq3. Organic/inorganic hybrid solar cells such as these would otherwise be prone to high electron hole recombination rates.

Other implementations are within the scope of the following claims. For example, an RS layer can be incorporated into other semiconductor structures that consist of different materials and/or have a different arrangement of materials. In some implementations, the selective tunneling layer can allow holes to tunnel through with higher probability than electrons. For example, in some cases, such as in certain organic materials, holes are of higher mobility (and lower effective mass) than electrons. In such cases, the RS layer can block most electrons (e.g., tunneling probability lower than about 50%, 40%, or 10%) and pass most holes (e.g., tunneling probability higher than about 50%, 60%, or 90%) and still provide the sieve effect to reduce recombination.

What is claimed is:

1. An apparatus, comprising:
    a semiconductor material structure that includes at least one region capable of generating electrons and holes each having an associated mean kinetic energy during operation, and comprises a p-type semiconductor material and an n-type semiconductor material, wherein the p-type semiconductor material comprises an organic material; and
    a material layer in proximity to the region, the material layer providing an associated potential energy larger than the mean kinetic energy associated with the generated electrons and the mean kinetic energy associated with the holes.

2. The apparatus of claim 1, wherein the material layer has a thickness such that electrons generated from the region having the mean kinetic energy tunnel through the material layer with a probability higher than about 50% and such that holes generated from the region having the mean kinetic energy tunnel through the material layer with a probability lower than about 50%.

3. The apparatus of claim 2, wherein the material layer has a thickness such that electrons generated from the region having the mean kinetic energy tunnel through the material layer with a probability higher than about 60% and such that holes generated from the region having the mean kinetic energy tunnel through the material layer with a probability lower than about 40%.

4. The apparatus of claim 3, wherein the material layer has a thickness such that electrons generated from the region having the mean kinetic energy tunnel through the material layer with a probability higher than about 90% and such that holes generated from the region having the mean kinetic energy tunnel through the material layer with a probability lower than about 10%.

5. The apparatus of claim 1, wherein the material layer has a thickness such that holes generated from the region having the mean kinetic energy tunnel through the material layer with a probability higher than about 50% and such that electrons generated from the region having the mean kinetic energy tunnel through the material layer with a probability lower than about 50%.

6. The apparatus of claim 1, wherein the material layer comprises a material that is electrically insulating.

7. The apparatus of claim 1, wherein the material layer consists essentially of a material selected from the group consisting of: a crystalline material, an amorphous material, an organic material, and a polymer material.

8. The apparatus of claim 1, wherein the material layer consists essentially of a material selected from the group consisting of: an oxide material, a nitride material, a fluoride material, and a chloride material.

9. The apparatus of claim 1, wherein the material layer consists essentially of a self-assembled monolayer.

10. The apparatus of claim 1, wherein the region of the semiconductor material structure is capable of generating pairs of electrons and holes in response to absorbing light in the semiconductor material structure.

11. The apparatus of claim 1, wherein the material layer is located closer to the region capable of generating electrons and holes than to an electrode of the semiconductor material structure.

12. The apparatus of claim 1, wherein the region capable of generating electrons and holes comprises a depletion region associated with the semiconductor materials.

13. The apparatus of claim 12, wherein the material layer is located between the p-type and n-type semiconductor materials.

14. The apparatus of claim 13, wherein the semiconductor material structure further comprises an intrinsic semiconductor material between the p-type and n-type semiconductor materials.

15. The apparatus of claim 14, wherein the material layer is located between the intrinsic semiconductor material and the n-type semiconductor material.

16. The apparatus of claim 1, further comprising an electrically conducting material configured to receive holes from the p-type semiconductor material, and an electrically conducting material configured to receive electrons from the n-type semiconductor material.

17. The apparatus of claim 16, further comprising a second material layer between the n-type semiconductor material and the electrically conducting material configured to receive electrons from the n-type semiconductor material, the second material layer having an associated potential energy larger than the mean kinetic energy associated with the generated electrons and the mean kinetic energy associated with the generated holes.

18. The apparatus of claim 1, wherein the p-type semiconductor material comprises a Phthalocyanine material.

19. The apparatus of claim 1, wherein the n-type semiconductor material comprises an inorganic material.

20. The apparatus of claim 19, wherein the n-type semiconductor material comprises Silicon.

21. The apparatus of claim 19, wherein the material layer comprises a crystalline material.

22. The apparatus of claim 21, wherein the material layer consists essentially of a material selected from the group consisting of: an oxide material, a nitride material, a fluoride material, and a chloride material.

23. The apparatus of claim 22, wherein the material layer comprises Lithium Fluoride.

24. The apparatus of claim 21, wherein the material layer has a thickness between about 0.2 nm and about 5 nm.

25. The apparatus of claim 24, wherein the material layer has a thickness between about 0.5 nm and about 2 nm.

26. The apparatus of claim 25, wherein the material layer has a thickness of about 1 nm.

27. The apparatus of claim 1, further comprising a plurality of material layers in proximity to the region, each of the material layers having an associated potential energy larger than the mean kinetic energy associated with the generated electrons and the mean kinetic energy associated with the generated holes.

28. The apparatus of claim 27, wherein at least some of the plurality of material layers are on a first side of the region, and at least some of the plurality of material layers are on a second side of the region opposite to the first side.

29. The apparatus of claim 1, wherein the material layer has an associated potential energy larger than a maximum kinetic energy associated with the generated electrons and holes.

30. The apparatus of claim 1, wherein the semiconductor material structure is configured as a solar cell.

31. The apparatus of claim 1, wherein the semiconductor material structure is configured as a photodetector.

32. A method for manufacturing a device, comprising:
providing a region in a semiconductor material structure of the device that, during operation of the device, generates electrons and holes, each having an associated mean kinetic energy, the semiconductor material structure comprising a p-type semiconductor material and an n-type semiconductor material, wherein the p-type semiconductor material comprises an organic material; and
incorporating a material layer in the semiconductor material structure in proximity to the region to allow electrons generated from the region having the mean kinetic energy to tunnel through the material layer with a probability higher than a first probability and to allow holes generated from the region having the mean kinetic energy to tunnel through the material layer with a probability lower than a second probability.

33. The method of claim 32, wherein the first probability is about 50% and the second probability is about 50%.

34. The method of claim 32, wherein the first probability is about 60% and the second probability is about 40%.

35. The method of claim 32, wherein the first probability is about 90% and the second probability is about 10%.

36. An apparatus, comprising:
a semiconductor material structure that includes at least one region capable of generating electrons and holes each having an associated mean kinetic energy during operation; and
a plurality of material layers in proximity to the region, each of the material layers having an associated potential energy larger than the mean kinetic energy associated with the generated electrons and the mean kinetic energy associated with the generated holes.

37. The apparatus of claim 36, wherein the material layers have a thickness such that electrons generated from the region having the mean kinetic energy tunnel through the material layer with a probability higher than about 50% and such that holes generated from the region having the mean kinetic energy tunnel through the material layer with a probability lower than about 50%.

38. The apparatus of claim 36, wherein the material layers have a thickness such that holes generated from the region having the mean kinetic energy tunnel through the material layer with a probability higher than about 50% and such that electrons generated from the region having the mean kinetic energy tunnel through the material layer with a probability lower than about 50%.

39. The apparatus of claim 36, wherein the material layers comprise a material that is electrically insulating.

40. The apparatus of claim 36, wherein the semiconductor material structure comprises a p-type semiconductor material and an n-type semiconductor material.

41. The apparatus of claim 40, wherein the region capable of generating electrons and holes comprises a depletion region associated with the semiconductor materials.

42. The apparatus of claim 41, wherein the material layers are located between the p-type and n-type semiconductor materials.

43. The apparatus of claim 42, wherein the semiconductor material structure further comprises an intrinsic semiconductor material between the p-type and n-type semiconductor materials.

44. The apparatus of claim 43, wherein the material layers are located between the intrinsic semiconductor material and the n-type semiconductor material.

45. The apparatus of claim 40, wherein the p-type semiconductor material comprises an organic material.

46. The apparatus of claim 45, wherein the n-type semiconductor material comprises an inorganic material.

47. The apparatus of claim 36, wherein at least some of the plurality of material layers are on a first side of the region, and at least some of the plurality of material layers are on a second side of the region opposite to the first side.

48. The apparatus of claim 36, wherein the semiconductor material structure is configured as a solar cell.

49. A method for manufacturing a device, comprising:
providing a region in a semiconductor material structure of the device that, during operation of the device, generates electrons and holes, each having an associated mean kinetic energy; and
incorporating a plurality of material layers in the semiconductor material structure in proximity to the region to allow electrons generated from the region having the mean kinetic energy to tunnel through each of the material layers with a probability higher than a first probability and to allow holes generated from the region having the mean kinetic energy to tunnel through the material layers with a probability lower than a second probability.

* * * * *